(12) United States Patent
Chen

(10) Patent No.: US 9,229,498 B2
(45) Date of Patent: Jan. 5, 2016

(54) ELECTRONIC DEVICE WITH HEAT DISSIPATION EQUIPMENT

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventor: Qiang Chen, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 184 days.

(21) Appl. No.: 14/144,372

(22) Filed: Dec. 30, 2013

(65) Prior Publication Data

US 2015/0153792 A1  Jun. 4, 2015

(30) Foreign Application Priority Data

Nov. 30, 2013  (CN) .................. 2013 1 06217760

(51) Int. Cl.

| | |
|---|---|
| *G06F 1/20* | (2006.01) |
| *H05K 7/20* | (2006.01) |
| *F25B 21/02* | (2006.01) |
| *F28F 13/00* | (2006.01) |
| *F25D 23/12* | (2006.01) |
| *F25D 17/06* | (2006.01) |

(52) U.S. Cl.
CPC . *G06F 1/20* (2013.01); *F25B 21/02* (2013.01); *F25D 17/06* (2013.01); *F25D 23/12* (2013.01); *F28F 13/00* (2013.01); *H05K 7/20* (2013.01)

(58) Field of Classification Search
CPC ............. G06F 1/20; H05K 7/20; F25D 23/12; F25D 17/06; F25B 21/02; F25B 29/00; F28F 13/00; F24F 5/00; F24H 3/04
USPC ............... 361/679.46–679.51, 688, 689–697, 361/700–714; 165/61, 80.2, 80.3, 80.4, 165/104.33, 104.34, 185, 121–126; 454/184; 312/223.2
See application file for complete search history.

(56) References Cited

U.S. PATENT DOCUMENTS

| | | | | |
|---|---|---|---|---|
| 4,949,218 | A * | 8/1990 | Blanchard et al. | ............ 361/696 |
| 5,255,520 | A * | 10/1993 | O'Geary et al. | ................. 62/3.2 |
| 5,446,619 | A * | 8/1995 | Madsen et al. | ................ 361/695 |
| 5,860,291 | A * | 1/1999 | Johnson et al. | .............. 62/259.2 |
| 6,463,743 | B1 * | 10/2002 | Laliberte | .......................... 62/3.3 |
| 6,597,569 | B1 * | 7/2003 | Unrein | ....................... 361/679.4 |
| 7,885,062 | B2 * | 2/2011 | Wagner et al. | ........... 361/679.49 |

(Continued)

*Primary Examiner* — Michail V Datskovskiy
(74) *Attorney, Agent, or Firm* — Novak Druce Connolly Bove + Quigg LLP

(57) ABSTRACT

An electronic device includes a chassis, a partition plate mounted in the chassis, a semiconductor refrigeration piece, a first heat sink, a second heat sink, a heat dissipation shell, and a fan. A space of the chassis is partitioned to a first space and a second space by the partition plate. The first heat sink is received in the first space, and engaged with a heating surface of the semiconductor refrigeration piece. The second heat sink is received in the second space, and engaged with a cooling surface of the semiconductor refrigeration piece. The heat dissipation shell is received in the second space, and the second heat sink is received in the heat dissipation shell. The first fan is mounted on a first end of the heat dissipation shell, and a second end of the heat dissipation pipe defines an air outlet.

10 Claims, 3 Drawing Sheets

(56) References Cited

U.S. PATENT DOCUMENTS 8,199,500 B2 * 6/2012 Yamagiwa .................... 361/692
8,553,411 B2 * 10/2013 Abraham et al. ........ 361/679.49
9,010,129 B2 * 4/2015 Lilke ................................ 62/3.6

* cited by examiner

ELECTRONIC DEVICE WITH HEAT DISSIPATION EQUIPMENT

BACKGROUND

1. Technical Field

The present disclosure relates to electronic devices, and particularly to an electronic device having heat dissipation equipment.

2. Description of Related Art

A number of vents is usually defined in a front panel of a computer chassis for dissipating heat. However, dust can go through the vents and accumulate in the chassis, which may lead to components in the chassis breaking down. Thus, people need to disassemble the chassis and clean out the dust from time to time. However, it is time-consuming and boring to do the cleaning job.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean "at least one".

Figure 1:
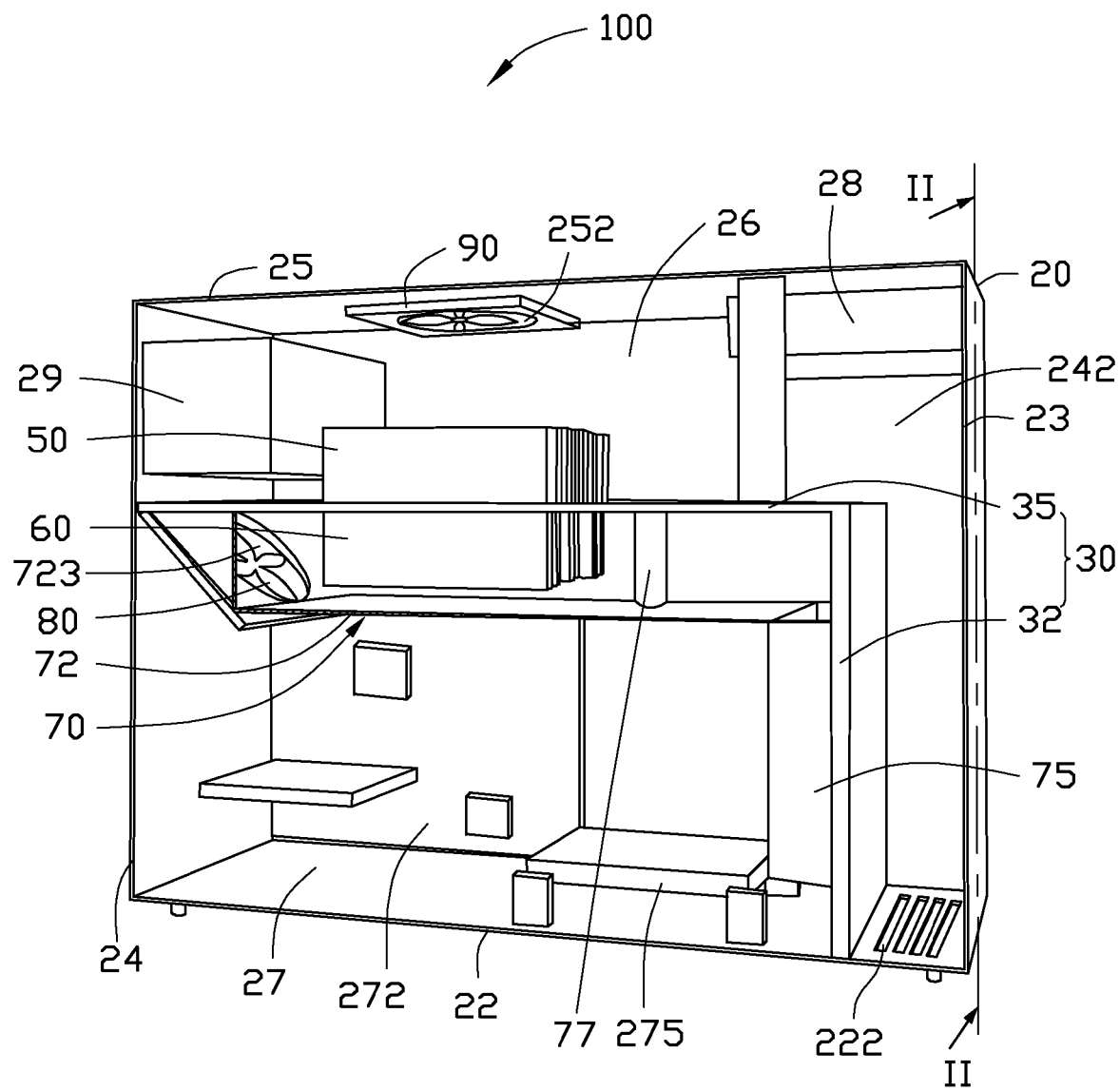
FIG. 1 is an assembled, isometric view of an embodiment of an electronic device, with a side panel omitted.
Figure 2:
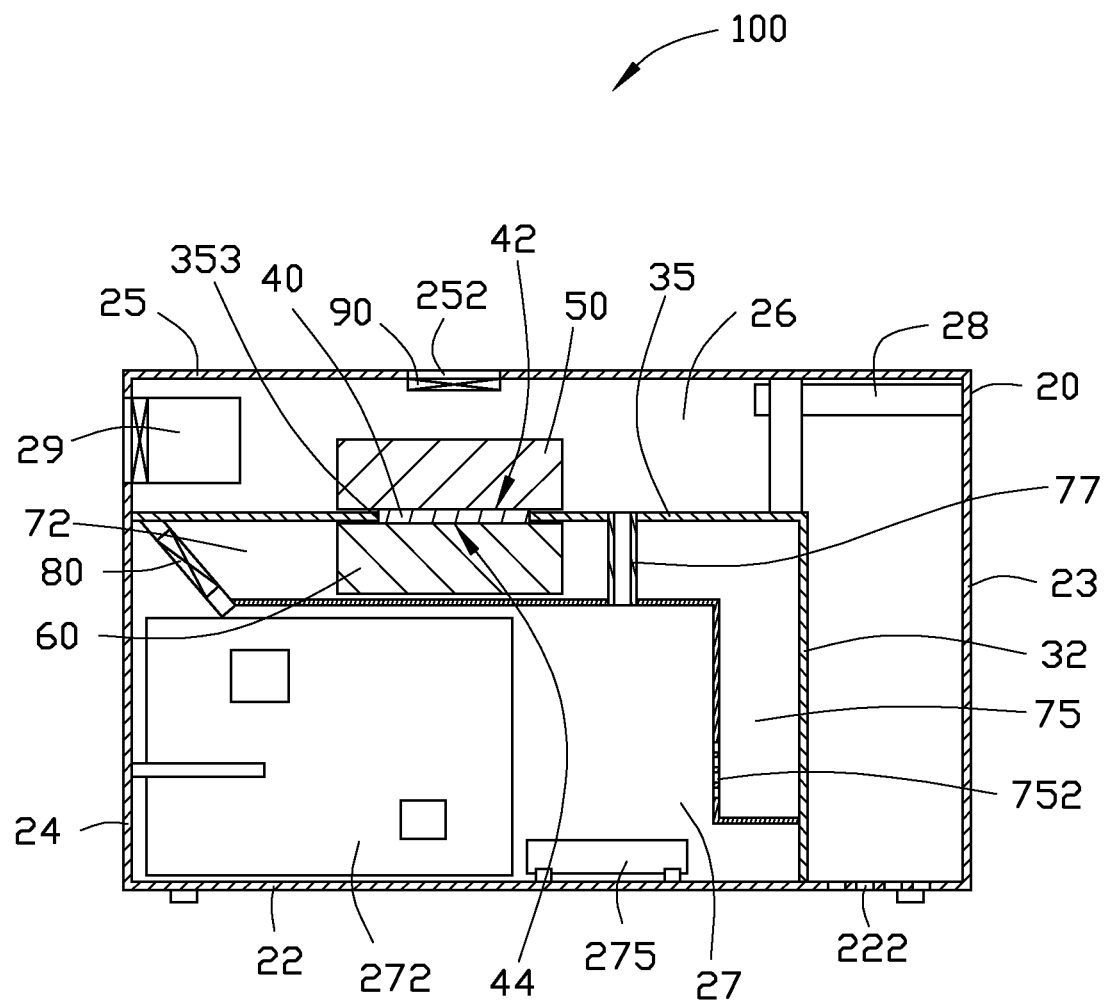
FIG. 2 is a cross-sectional view of FIG. 1, taken along the line of II-II.

FIGS. 1 and 2 show an embodiment of an electronic device 100 comprising a chassis 20, a substantially L-shaped partition plate 30 located in the chassis 20, a semiconductor refrigeration piece 40, a first heat sink 50, a second heat sink 60, a substantially L-shaped heat dissipation shell 70, a first fan 80, and a second fan 90.

The chassis 20 comprises a bottom wall 22, a front wall 23 perpendicularly extending up from a front end of the bottom wall 22, a rear wall 24 perpendicularly extending up from a rear end of the bottom wall 22, a top wall 25 connected between top ends of the front wall 23 and the rear wall 24, and two side walls 242 (only one of which is shown) detachably installed to two sides of the chassis 20. The partition plate 30 comprises a supporting portion 32 perpendicularly extending up from the bottom wall 22 and an installing portion 35 perpendicularly extending rearward from a top end of the supporting portion 32. A bottom end of the supporting portion 32 is mounted on the bottom wall 22, and adjacent to the front wall 23. A distal end of the installing portion 35 is mounted to the rear wall 24. The partition plate 30 partition a space of the chassis 20 into a first space 26 and a second space 27. The top wall 25, the front wall 23, the rear wall 24, and the partition plate 30 cooperatively bound the first space 26. The bottom wall 22, the rear wall 24, and the partition plate 30 cooperatively bound the second space 27. The bottom wall 22 defines a plurality of air inlets 222 positioned between the supporting portion 32 and the front wall 23. The top wall 25 defines an air outlet 252 facing the installing portion 35. A compact disc read-only memory (CD-ROM) 28 is received in the first space 26, and located at a junction of the front wall 23 and the top wall 25. A power supply 29 is received in the first space 26, and located at a junction of the rear wall 24 and the top wall 25. A motherboard 272 mounted on the side wall 242, a plurality of hard disk drives 275, and other electronic components are received in the second space 27. Dustproof sponge is attached to inner surfaces of the side walls 242.

The installing portion 35 defines a receiving hole 353 adjacent to the air outlet 252 of the top wall 25. The semiconductor refrigeration piece 40 is received in the receiving hole 353. The semiconductor refrigeration piece 40 comprises a cooling surface 44 facing the second space 27 and a heating surface 42 facing the first space 26. The first heat sink 50 is received in the first space 26, and attached to the heating surface 42 of the semiconductor refrigeration piece 40. The second heat sink 60 is received in the second space 27, and attached to the cooling surface 44 of the semiconductor refrigeration piece 40. The second fan 90 is mounted to the top wall 25, and aligns with the air outlet 252.

The heat dissipation shell 70 is received in the second space 27, and comprises a cooling pipe 72 mounted to a bottom of the installing portion 35 and an air guiding pipe 75 extending down from an end of the cooling pipe 72 adjacent to the supporting portion 32. The guiding air pipe 75 is mounted to the supporting portion 32. The second heat sink 80 is received in the cooling pipe 72. An opposite end of the cooling pipe 72 defines an air inlet 723 adjacent to and facing the rear wall 24. The first fan 80 is installed to the cooling pipe 72, and opposite to the air guiding pipe 75. A distal end of the air guiding pipe 75 defines a plurality of air outlets 752 communicating with the second space 27. A pipe 77 extends up and down through the cooling pipe 72 and the installing portion 35, to communicate the first space 26 with the second space 27, for receiving cables. Airflow from the second space 27 is blown by the first fan 80 to enter the heat dissipation shell 70 through the air inlet 723. The airflow entering the heat dissipation shell 70 is cooled by the second heat sink 60, and then enters the second space 27 through the air outlets 752, to cool the motherboard 272, the hard disk drives 275, and the other electronic components. In the embodiment, the heat dissipation shell 70 is made of insulation material, such as plastic.

Figure 3:
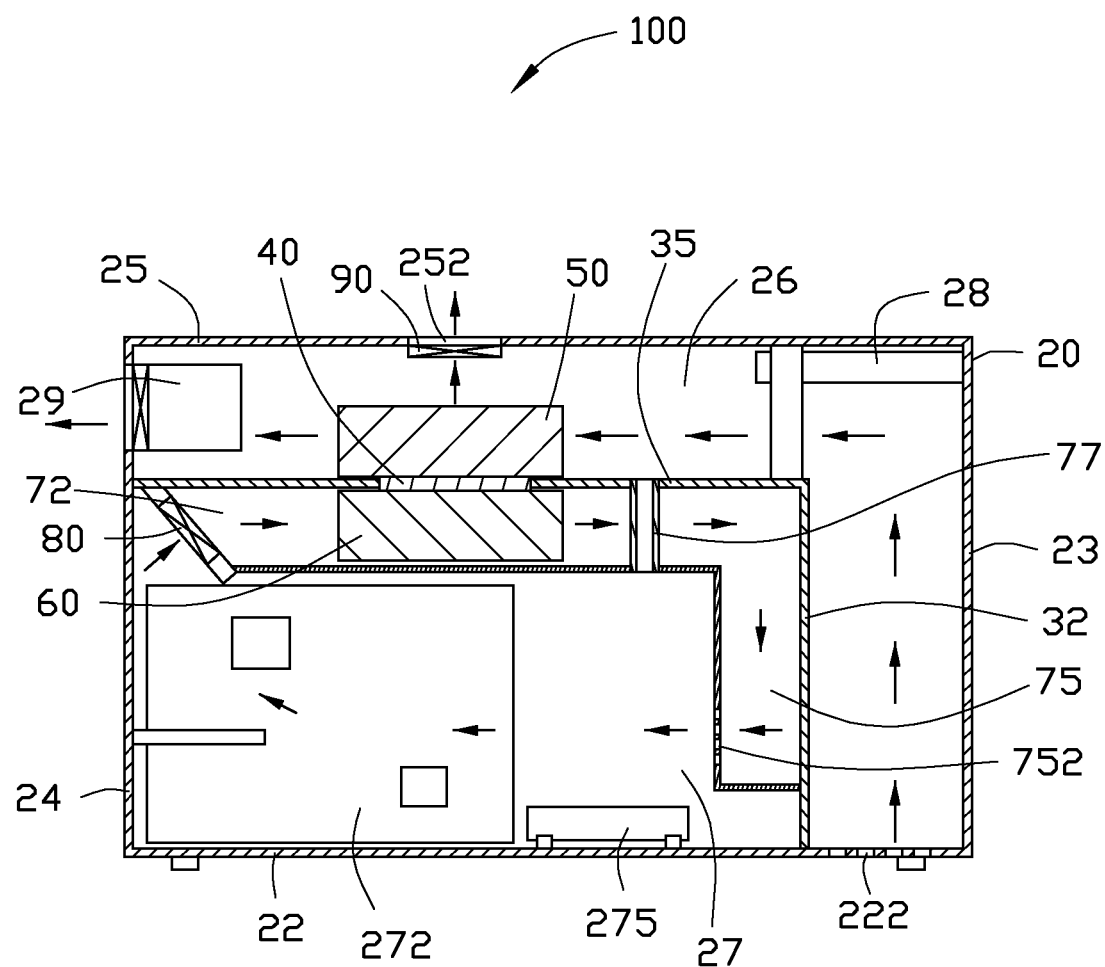
FIG. 3 is similar to FIG. 2, but shows the electronic device in a state of use.

FIG. 3 shows that the electronic device 100 in use. The side walls 242 of the chassis 20 are installed to the chassis 20, to shield the first and second spaces 26 and 27. The motherboard 272 and the hard disk drives 275 generate heat transferred to the air of the second space 27. The air of the second space 27 is heated. The first fan 80 operates to suck the heated air of the second space 27 into the cooling pipe 72 through the air inlet 723. The semiconductor refrigeration piece 40 operates to cool the second heat sink 60. The heat of the heated air received in the cooling pipe 72 is transferred to the second heat sink 60, and the heat of the second heat sink 60 is transferred to the first heat sink 50 through the semiconductor refrigeration piece 40. The heated air received in the cooling pipe 72 is cooled. The cool air flows through the guiding air pipe 75, and enters the second space 27 through the air outlets 752, for dissipating heat of the motherboard 272 and the hard disk drives 275. The second fan 90 operates to suck cool air into the first space 26 through the air inlet 222. The CD-ROM 28 generates heat. The cool air flows through the CD-ROM 28 and the first heat sink 50, and the heat of the first heat sink 50 is transferred to the cool air. The cool air is heated. The heated air is dissipated out of the chassis 20 by the second fan 90 through the air outlet 252.

It is to be understood, that even though numerous characteristics and advantages of the embodiment have been set forth in the foregoing description, together with details of the structure and function of the embodiment, the disclosure is illustrative only, and changes may be made in detail, especially in the matters of shape, size, and arrangement of parts within the principles of the present disclosure to the full extent indicated by the broad general meaning of the terms in which the appended claims are expressed.

What is claimed is:

1. An electronic device, comprising:
   a chassis;
   a partition plate located in the chassis, and partitioning the chassis into a first space and a second space;
   a semiconductor refrigeration piece mounted to the partition plate, and comprising a cooling surface facing the second space, and a heating surface facing the first space;
   a first heat sink received in the first space and attached to the heating surface of the semiconductor refrigeration piece;
   a second heat sink received in the second space and attached to the cooling surface of the semiconductor refrigeration piece;
   a heat dissipation shell received in the second space, and defining a first air inlet in a first end of the heat dissipation shell and a first air outlet in a second end of the heat dissipation shell away from the first air inlet; and
   a first fan attached to the heat dissipation shell, and adjacent to and aligning with the first air inlet;
   wherein the second heat sink is received in the heat dissipation shell, the first fan operates to suck the air of the second space into the heat dissipation shell, the semiconductor refrigeration piece cools the second heat sink, the heat of the air received in the heat dissipation shell is transferred to the second heat sink, and the heat of the second heat sink is transferred to the first heat sink through the semiconductor refrigeration piece.

2. The electronic device of claim 1, wherein the chassis comprises a bottom wall, a front wall, a rear wall, and a top wall, the partition plate comprises a supporting portion perpendicularly mounted on the bottom wall, and an installing portion extending rearward from a top end of the supporting portion and mounted to the rear wall, the bottom wall, the rear wall, and the partition plate cooperatively bound the second space, the top wall, the front wall, the rear wall, and the partition plate cooperatively bound the first space.

3. The electronic device of claim 2, wherein the partition plate is L-shaped.

4. The electronic device of claim 2, wherein the chassis defines a plurality of second air inlets and a second air outlet communicating with the first space.

5. The electronic device of claim 4, wherein the plurality of second air inlets is defined in the bottom wall and between the supporting portion and the front wall, the second air outlet is defined in the top wall.

6. The electronic device of claim 4, further comprising a second fan mounted to the top wall, wherein the second fan aligns with the second air outlet, the second fan operates to suck the air into the first space of the chassis through the plurality of second air inlets, the air flows through the first heat sink, and is dissipated out of the chassis from the second air outlet.

7. The electronic device of claim 2, wherein the installing portion defines a receiving hole, the semiconductor refrigeration piece is located in the receiving hole, the first heat sink is mounted to the installing portion.

8. The electronic device of claim 2, wherein the heat dissipation shell comprises a cooling pipe located below the installing portion, and a guiding air pipe extending from one end of the cooling pipe away from the first fan, the second heat sink is received in the cooling pipe, the first air outlet is defined in the guiding air pipe away from the cooling pipe, the first fan is mounted to the cooling pipe.

9. The electronic device of claim 1, further comprising a pipe extending through the heat dissipation shell and the partition plate, wherein the pipe communicates with the first and second spaces.

10. The electronic device of claim 1, wherein the heat dissipation shell is made of insulation material.

* * * * *